United States Patent [19]
Arghavani et al.

[11] Patent Number: 6,140,251
[45] Date of Patent: *Oct. 31, 2000

[54] METHOD OF PROCESSING A SUBSTRATE

[75] Inventors: Reza Arghavani, Aloha; Robert S. Chau, Beaverton; Weimin Han, Portland, all of Oreg.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/987,888

[22] Filed: Dec. 10, 1997

[51] Int. Cl.⁷ .......................... H01L 21/31; H01L 21/469
[52] U.S. Cl. .......................... 438/778; 438/774; 438/789; 438/790
[58] Field of Search .................. 438/789, 790, 438/794, 793, 778, 774

[56] References Cited

U.S. PATENT DOCUMENTS

| | | | |
|---|---|---|---|
| 5,719,085 | 2/1998 | Moon et al. | 438/424 |
| 5,817,549 | 10/1998 | Yamazaki et al. | 438/789 |
| 5,891,809 | 4/1999 | Chau et al. | 438/770 |

*Primary Examiner*—Charles Bowers
*Assistant Examiner*—Hsien Ming Lee
*Attorney, Agent, or Firm*—Blakely, Sokoloff, Taylor & Zafman LLP

[57] ABSTRACT

A method of processing a semiconductor substrate, comprising the steps of: heating a substance within a first chamber, at a selected temperature which is above the minimum decomposition temperature of the substance, to cause decomposition of the substance into a predetermined gas; cooling the gas to below the minimum decomposition temperature of the substance; transporting the gas from the first chamber to a second chamber; and exposing a semiconductor substrate, located in the second chamber, to the cooled gas.

24 Claims, 4 Drawing Sheets

METHOD OF PROCESSING A SUBSTRATE

BACKGROUND OF THE INVENTION

1). Field of the Invention

The present invention relates generally to a method of processing a semiconductor substrate, and more specifically to a method of forming a layer, such as an oxide layer or a nitrogen containing layer, on a semiconductor substrate.

2). Discussion of Related Art

Semiconductor processing often comprises the heating of a substance within the chamber so that the substance combusts or otherwise decomposes to form a gas. A substrate, located in the chamber, is then exposed to the gas so that a layer is grown on the substrate. A problem with such a process is that the combustion or decomposition temperature is often too high for purposes of forming the layer. A temperature of formation which is too high results in the layer formation too fast for purposes of proper control.

For example, the manufacture of a metal oxide semiconductor (MOS) transistor involves the step of forming a gate oxide layer by exposure of a semiconductor substrate to oxygen, usually in the form of water vapor. During the formation of the gate oxide layer it is advantageous also to expose the substrate to a chlorine containing gas, resulting in chlorine being taken up in the gate oxide layer. Chlorine has various uses—see for example *Silicon Processing for the VLSI Era* by S. Wolf et al, page 215. The chlorine is obtained from a gas such as dichloroethylene (DCE) which is combusted with oxygen to form HCl gas. The minimum combustion temperature of DCE is about 700° C., below which DCE does not fully combust, resulting in carbon in the combusted gas which is taken up by the gate oxide layer. At a temperature of 700° C. and above, however, the growth rate of the gate oxide layer is too fast, resulting in less control over the formation thereof. This is troublesome, especially for purposes of forming a stable, uniform gate oxide layer of less than 20 Å thick.

Another example of the formation of a layer by the decomposition of a substance at an elevated temperature can be found in the specification of U.S. patent application Ser. No. 08/775,571 wherein $N_2O$ gas is decomposed at a temperature of between 900° C. and 1050° C. to form a gas. The gas is then used for purposes of growing an oxy-nitride layer.

SUMMARY OF THE INVENTION

The invention provides a method of processing a semiconductor substrate. A substance is heated within a first chamber, at a selected temperature which is above the minimum decomposition temperature of the substance, to causing decomposition of the substance into a predetermined gas. The gas then is cooled to below the minimum decomposition temperature of the substance and moved to a second chamber. A semiconductor substrate, located in the second chamber, is then exposed to the gas at the temperature to which it is cooled.

BRIEF DESCRIPTION OF THE DRAWINGS

The invention is further described by way of examples with reference to the accompanying drawings, wherein.

DESCRIPTION OF THE INVENTION

A method of processing a semiconductor substrate is described. In the following description, for purposes of explanation, numerous specific details are set forth in order to provide a thorough understanding of the present invention. It will be evident, however, to one skilled in the art that the present invention may be practiced without these specific details. In other instances well known semiconductor processes and methods have not been described in detail in order to not obscure the present invention.

The present invention describes a method of processing a semiconductor substrate, which method utilizes the decomposition of a substance at an elevated temperature. A substance is heated within a first chamber, at a selected temperature which is above the minimum decomposition temperature of the substance, causing decomposition of the substance into a predetermined gas. The gas then is cooled to below the minimum decomposition temperature of the substance and transported to a second chamber. A semiconductor substrate, located in the second chamber, is then exposed to the gas at the temperature to which it is cooled.

Figure 1:
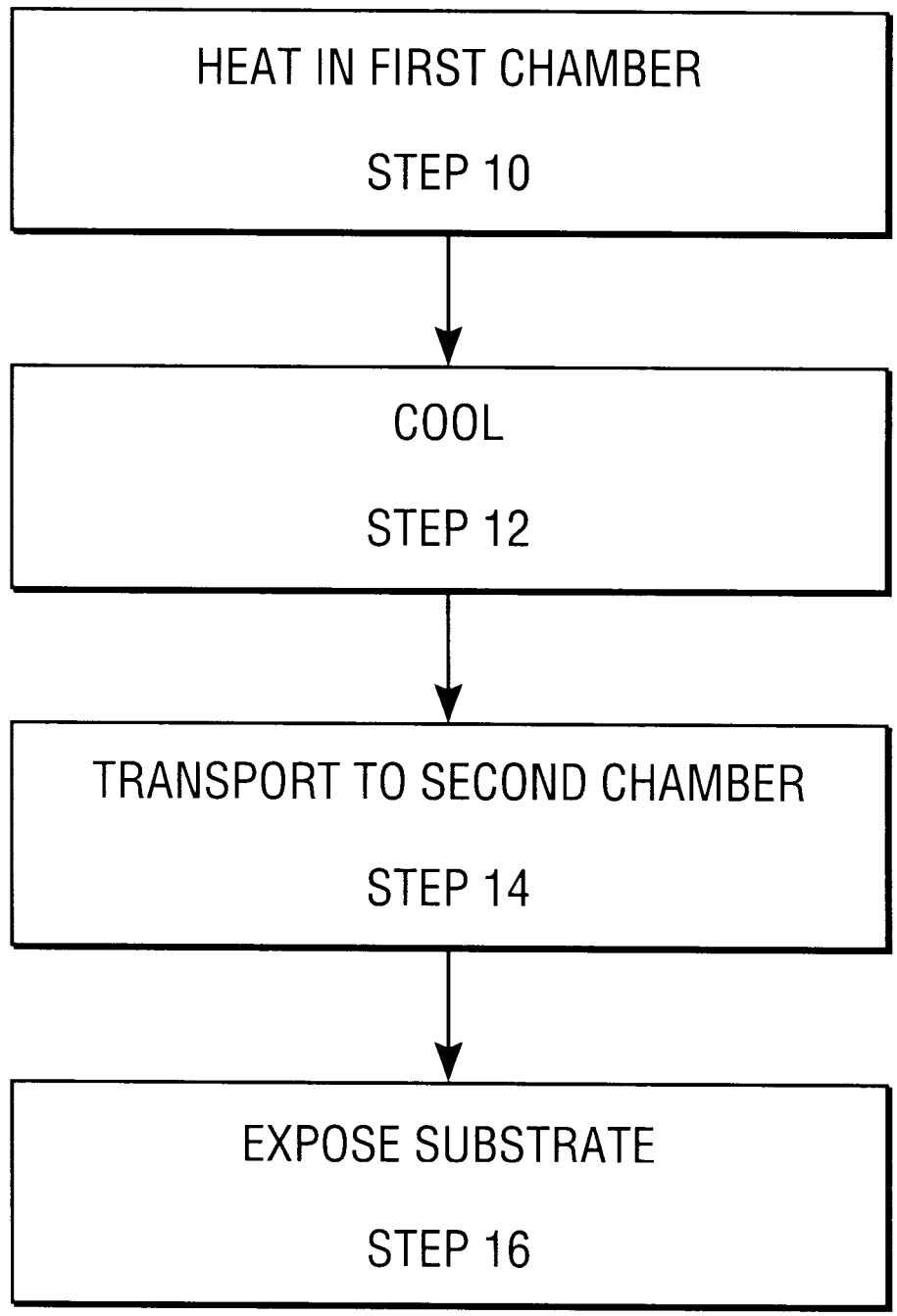
FIG. 1 is a flow chart which illustrates a process of the present invention.

FIG. 1 of the accompanying drawings illustrates a method of processing a semiconductor substrate, according to the invention.

In step 10, a substance is heated within a first chamber at a selected temperature which is above the minimum decomposition temperature of the substance. The heating causes the substance to decompose into a predetermined gas. The decomposition temperature is typically at least 5° C. above the minimum decomposition temperature of the substance. Specific processes, substances, and decomposition temperatures will be given in the examples that follow hereinbelow.

In step 12, the gas is cooled to below the minimum decomposition temperature of the substance. The gas is typically cooled by at least 25° C. below the minimum decomposition temperature of the substance. Specific cooling temperatures will be given in the examples that follow hereinbelow.

In step 14, the gas is transported to the second chamber, typically by flowing through a pipe connecting the first and second chambers.

In step 16, a semiconductor substrate, located in the second chamber, is exposed to the gas. Exposure of the substrate to the gas results in the gas reacting with the substrate to form a layer on the substrate. Specific examples of exposure of the substrate will be given in the examples that follow.

The selected temperature of the first step 10 is high enough to cause decomposition of the substance, but may be too high for purposes of exposing the semiconductor substrate to the gas. By cooling the gas and then transporting the gas to the second chamber, the temperature, at which the substrate is exposed to the gas, is reduced. Should, for example, a layer be formed on the substrate by exposure to the gas, the reduced temperature results in a slower formation of the layer. Slower formation of the layer results in more informity of the resulting layer and more control over the formation thereof. More control over the formation of the layer, in turn, is desirable because it results in a thickness of the resulting layer which can more accurately be effected.

Figure 2:
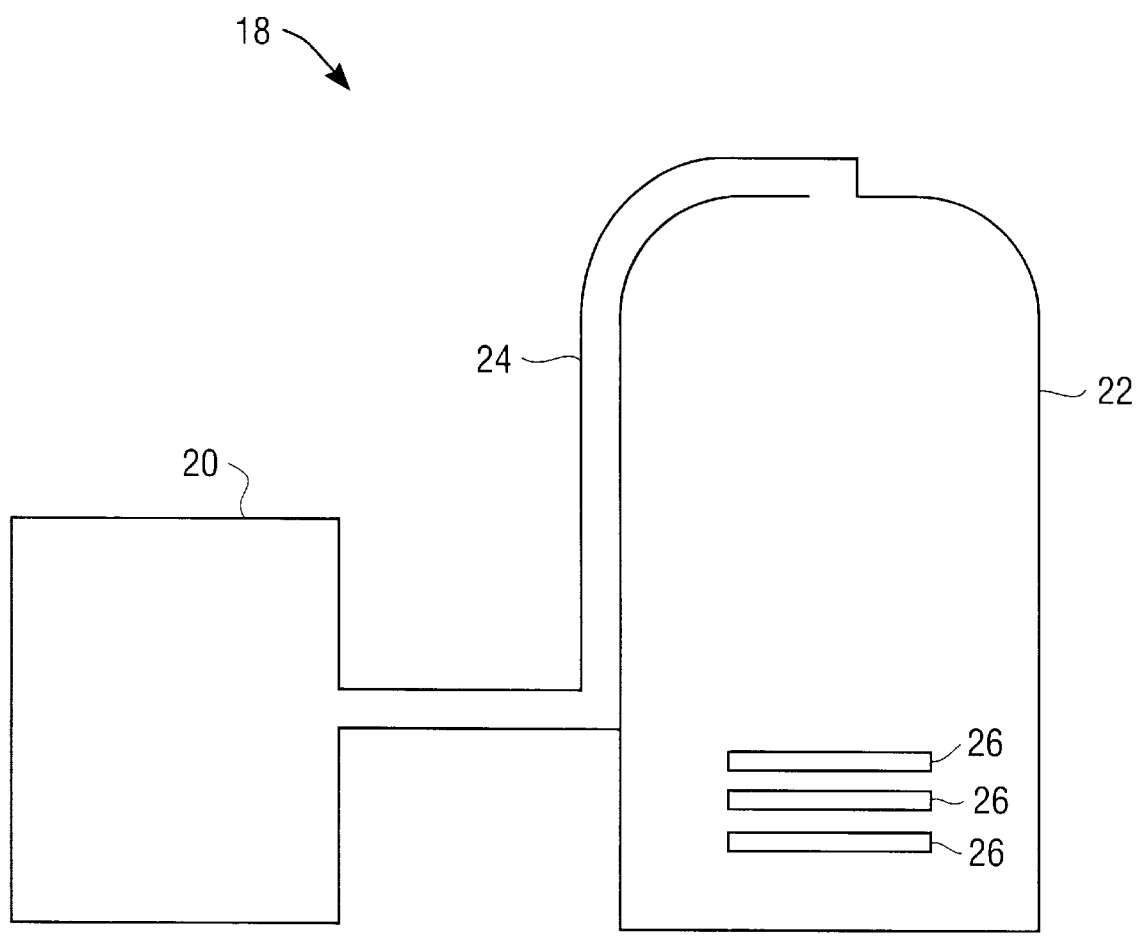
FIG. 2 is a sectional side view of a system which can be used for carrying out the present invention.

FIG. 2 of the accompanying drawings illustrates a system 18 which can be used for carrying out the method of FIG. 1.

The system 18 includes a decomposition chamber 20, a growth chamber 22 and a pipe 24 connecting the two chambers. A set of susceptors 26 are located within the growth chamber 22 for purposes for receiving a set of substrates.

The decomposition chamber 20 is maintained at a temperature above the minimum decomposition temperature of the substance so as to cause decomposition of the substance into the predetermined gas (step 10). The gas then flows through the pipe 24 to the growth chamber 22 (step 14). The gas is cooled while flowing through the pipe (step 12). The substrate, located on the susceptor 26, is then exposed to the gas within the growth chamber 22 (step 16).

The first chamber is generally smaller and requires less energy in order to combust the substance than the second chamber. Combustion or decomposition of the substance in the first chamber thus results in an energy saving which may be required in order to comply with a thermal budget.

The decomposition chamber 20 and the growth chamber 22 may be made of quartz for low contamination reasons. The pipe 24 may be made of any material also having low contamination levels and has a length, wall thickness, and diameter which are sufficient for purposes of cooling the gas.

One such system is manufactured by Kokusai, Japan and is located at Intel Corporation, Portland, Oreg., USA.

EXAMPLE 1

Figure 3A:
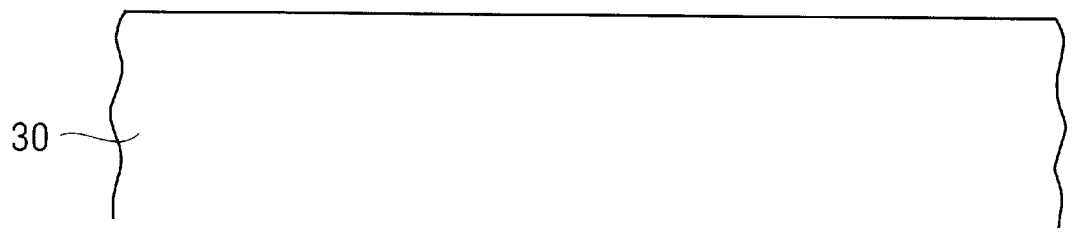
FIG. 3a is a sectioned side view illustrating a semiconductor substrate.

As previously discussed, the manufacture of an MOS semiconductor transistor involves the step of forming a gate oxide layer by exposure of a semiconductor substrate to oxygen. FIG. 3a illustrates a semiconductor substrate 30 before an gate oxide layer is formed thereon.

In one example the decomposition chamber 20 is maintained at a temperature of about 900° C. and a series of semiconductor substrates 30 are located on the susceptors 26 in the growth chamber 22.

A mixture of oxygen and dichloroethylene (DCE, chemical formula: $C_2H_2Cl$) is then introduced into the decomposition chamber 20 and caused to combust according to the formula:

$$C_2H_2Cl_2 + O_2 \rightarrow CO_2 + HCl + H_2O.$$

The $CO_2$ is scrubbed out utilizing known scrubbing techniques and the HCl and the $H_2O$, both in a gaseous state, flow through the pipe 24 to the growth chamber 22. The pipe 24 is exposed to a cooler ambient, therefore causing cooling of the HCl and $H_2O$ gasses to a temperature of about 675° C.

The substrate is then exposed to the gasses so that the gasses form a $SiO_2$ and SiCl layer on the substrate.

Figure 3B:
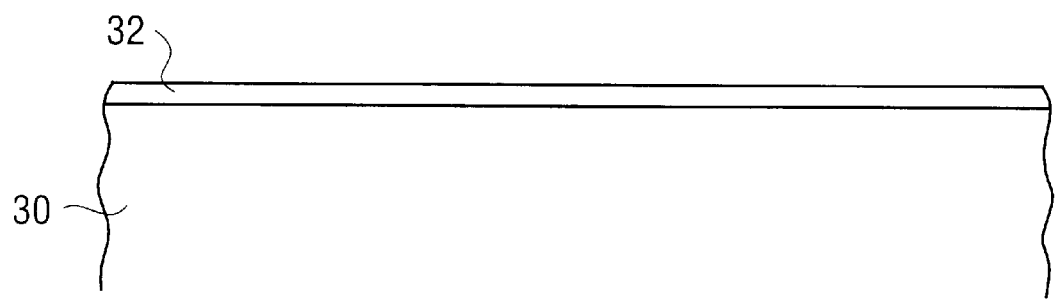
FIG. 3b is a sectioned side view of the substrate of FIG. 3a after forming an oxide layer.
Figure 3C:
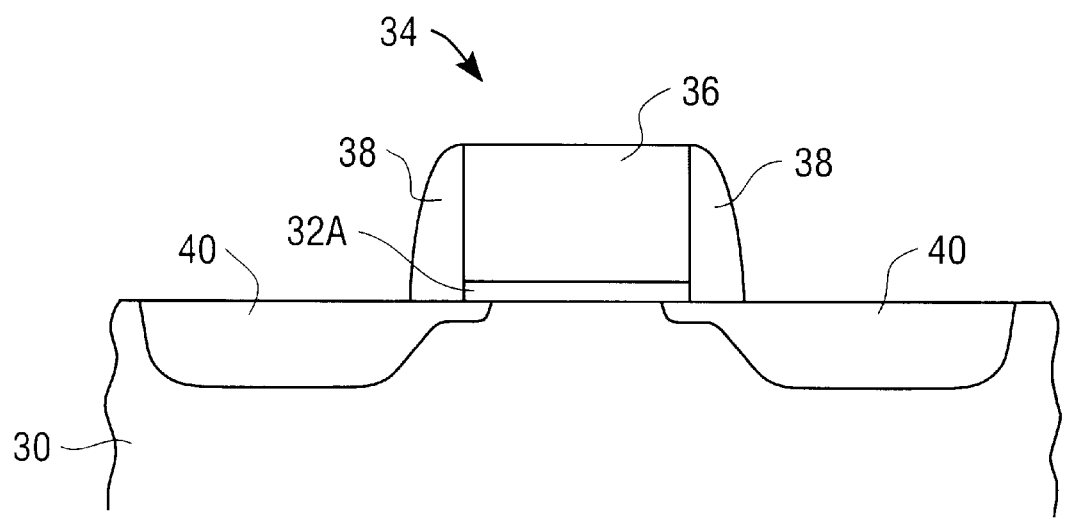
FIG. 3c is a sectioned side view of the substrate of FIG. 3b after an MOS transistor is formed thereon.

At a temperature of 675° C. the layer typically forms at a rate of less than 10 Å every minute which is generally sufficient to grow a stable uniform gate oxide layer of less than 20 Å, or even of less than 10 Å. The formation of the layer may be terminated after one minute to render an oxide layer of less than 10 Å. Further formation of the oxide layer may then be carried utilizing another source of oxygen such as steam only. Forming of the oxide layer may then be terminated when the oxide layer has an overall thickness of about 20 Å. Such further formation of an oxide layer, as described, is generally referred to in the art as "wet oxidation". Wet oxidation is generally carried out at about the same temperature as DCE oxidation due to time constraints in the formation of the respective oxidation steps. By reducing the DCE oxidation temperature, the temperature at which wet oxidation is carried out can also be reduced. FIG. 3b illustrates the substrate 30 of FIG. 3a after the formation of the oxide layer, indicated by the reference number 32. FIG. 3c illustrates the substrate 30 after the formation of a MOS transistor 34 on the substrate, wherein the oxide layer 32, of FIG. 2, forms a gate oxide layer 32A of the transistor 34. The transistor is formed according to methods which are known in the art. A MOS transistor is typically formed by forming a polysilicon layer on the gate oxide layer 32. The polysilicon layer and the gate oxide layer 32 are then etched to form a gate 36 and gate oxide layer 38A. Regions 40 on either side of the spacers 38 are then lightly doped. Spacers 38 are then formed on sides of the gate 36 and the gate oxide layer 38A, whereafter outer portions of the regions 40 are further doped. By forming the oxide layer according to the invention, an MOS transistor 34 is thus formed having a thin, stable and uniform gate oxide layer 32A, and therefore a transistor having a reduced reaction time.

It should be noted that the combustion temperature of 900° C. is merely by way of example, and could be anything above the minimum combustion temperature of the $C_2H_2Cl_2$ of about 700° C. Even a temperature of a few degrees, such as 5° C. above 700° C., will suffice for combustion purposes. It should also be understood that the temperature may be measured at a location within the growth chamber 22 where the temperature is higher than the temperature at the substance being combusted. A measured combustion temperature of above 800° C. is generally regarded as a safe for ensuring that the temperature at the substrate is maintained above 700° C. Furthermore, by choosing the temperature of the decomposition temperature high enough would also allow for decomposition of other substances having minimum decomposition temperatures above 700° C.

The temperature of 675° C. at which the layer forms is also merely by way of example. This temperature can be reduced or increased to alter the rate at which the layer forms. A reduced temperature at which the layer forms will generally result in a slower, more uniform, formation of the layer.

Furthermore, the use of $C_2H_2Cl_2$ is also merely by way of example as other chlorine containing substances may also be combusted in a similar manner. A non-limiting list of such chlorine containing substances includes tricholorethylene (TCE) and trichoroethane (TCA).

EXAMPLE 2

In another example the system 18 of FIG. 2 is operated to form an $NO_2$ gas which reacts with a semiconductor substrate. The combustion chamber 20 is operated at a temperature of about 900° C. to cause dissociation and recombination of a mixture of $N_2O$ gas and $O_2$ gas according to the following reactions:

(1) $N_2O \rightarrow N_2 + O$ (2) $N_2O + O \rightarrow 2NO$ (3) $2NO + O_2 \rightarrow 2NO_2$ The $NO_2$ gas resulting from the reactions flows through the pipe 24 to the growth chamber 22, reaching the growth chamber 22 at about 800° C. The semiconductor substrate located in the growth chamber 22 is then exposed to the NO$_2$ gas.

Figure 4A:
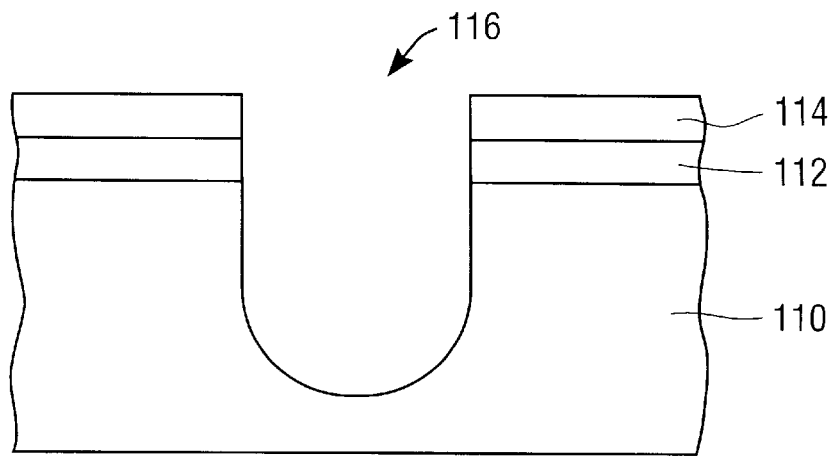
FIG. 4a is a sectioned side view of a substrate.
Figure 4B:
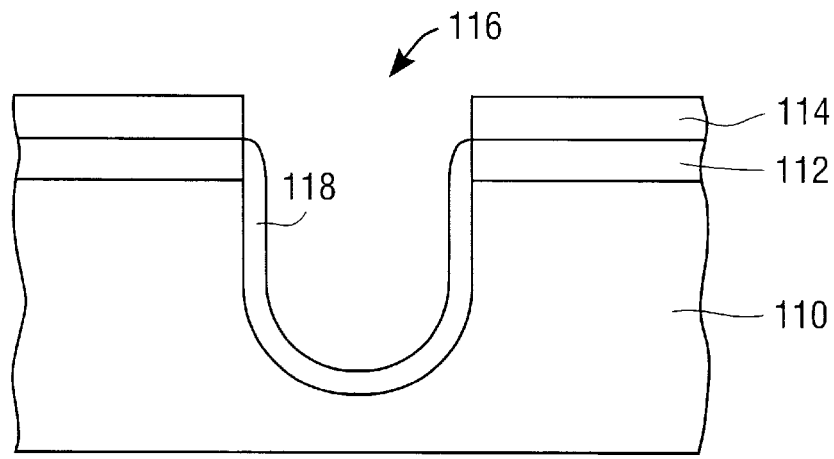
FIG. 4b is a sectioned side view of the substrate of FIG. 4a after the formation of a trench sidewall.

NO$_2$ exposure of a semiconductor substrate may be required for various reasons. FIGS. 4a and 4b show a trench isolation structure and a method for making that structure that will prevent dopant outdiffusion by forming a barrier between the trench and an active region so that the dopants of the active region are not able to outdiffuse into the trench.

FIG. 4a illustrates a semiconductor substrate 110 with a pad oxide layer 112 and a polish stop layer 114 deposited thereon. The polish stop layer 114 and pad oxide 112 are patterned and the substrate 110 is etched to form a trench 116.

Figure 4C:
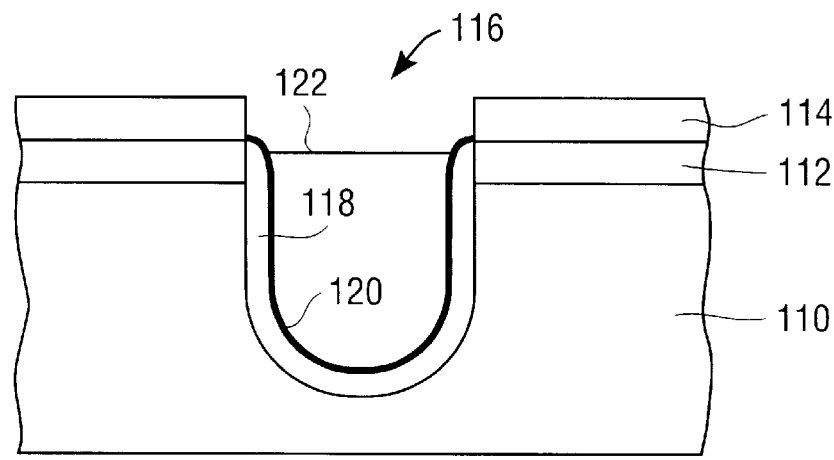
FIG. 4c is a sectioned side view similar to FIG. 4b after the formation of an oxy-nitride surface.

A trench sidewall oxide 118 is then formed in the trench 116, as is illustrated in FIG. 4b. After the trench sidewall oxide 118 if formed then the trench sidewall oxide 118 is subjected to an N$_2$O nitridation step, utilizing the deposition method as hereinbefore described. The N$_2$O reacts with the trench sidewall oxide to create an oxy-nitride layer 120 on the surface of the trench sidewall oxide 118, as is illustrated in FIG. 4c. Next the trench is filled in with an oxide to form trench fill oxide 122, and further processing is carried out.

Again, the dissociation and recombination temperature of 900° C. is merely by way of example. N$_2$O dissociates at a temperature of about 850° C. and any temperature above that will be sufficient. It can also be seen that the same temperature, within the decomposition chamber 2, of 900° C. can be used for multiple processes, such as described in Example 1 or Example 2.

The use of NO$_2$ is also merely by way of example as other substances exist which dissociate at elevated temperatures to yield nitrogen containing gas which can be used for deposition purposes.

It can thus be seen that the substrate can be exposed to the NO$_2$ at a temperature which is below the dissociation temperature of the N$_2$O.

What is claimed:

1. A method of processing a semiconductor substrate, comprising:
   heating a substance within a first chamber, at a selected temperature which is above a minimum decomposition temperature of the substance, to cause decomposition of the substance into a predetermined gas;
   cooling the gas to below the minimum decomposition temperature of the substance;
   transporting the gas from the first chamber to a second chamber; and
   exposing a semiconductor substrate, located in the second chamber, to the cooled gas to grow a layer on the substrate, the material of the layer including material from the semiconductor substrate.

2. The method of claim 1 wherein the selected temperature is at least 5° C. above the minimum decomposition temperature of the substance.

3. The method of claim 2 wherein the gas is cooled by at least 25° C. below the minimum decomposition temperature of the substance.

4. The method of claim 1 wherein the gas flows from the first chamber to the second chamber.

5. The method of claim 4 wherein the gas is cooled while flowing from the first chamber to the second chamber.

6. The method of claim 1 wherein exposure of the semiconductor substrate to the gas causes a layer to form on the substrate.

7. The method of claim 6 which, further comprising:
   terminating the formation of the layer on the substrate when the layer has a thickness of less than 20 Å.

8. The method of claim 7 wherein the layer is formed over a period of at least 2 minute.

9. A method of forming an oxide layer, comprising:
   heating a chlorine containing substance within a first chamber, at a temperature which is selected above a minimum decomposition temperature of the substance, to cause decomposition of the substance into a predetermined gas;
   cooling the gas to below the minimum decomposition temperature of the chlorine containing substance;
   transporting the gas from the first chamber to a second chamber; and
   exposing a semiconductor substrate, located in the second chamber, to oxygen and the chlorine of the gas to grow the oxide layer thereon, the oxide layer including material from the semiconductor substrate.

10. The method of claim 9 wherein the layer is formed at a rate of less than 10 Å per minute.

11. The method of claim 9 wherein the substance has a chemical formula: $C_xH_yCl_z$.

12. The method of claim 11 wherein x=2; y=2; z=2.

13. The method of claim 11 wherein x=2; y=3; z=3.

14. The method of claim 9 wherein the gas is cooled by at least 25° C. below the minimum decomposition temperature of the substance.

15. A method of forming a metal oxide silicon transistor comprising:
   forming a gate oxide layer on a substrate, including:
   heating a chlorine containing substance within a first chamber, at a temperature which is selected above a minimum decomposition temperature of the substance, to cause decomposition of the substance into a predetermined gas;
   cooling the gas to below the minimum decomposition temperature of the substance;
   transporting the gas from the first chamber to a second chamber; and
   exposing a semiconductor substrate, located in the second chamber, to oxygen and the chlorine of the gas to grow a layer on the semiconductor substrate, the layer including oxygen and chlorine from the gas and material from the semiconductor substrate.

16. The method of claim 9 wherein the gas is cooled by at least 25° C. below the minimum decomposition temperature of the substance.

17. A method of forming a nitrogen containing layer on a semiconductor substrate, comprising:
   heating a nitrogen containing substance within a first chamber, at a temperature which is selected above a minimum decomposition temperature of the substance, to cause decomposition of the substance into a predetermined gas;
   cooling the gas to below the minimum decomposition temperature of the substance;
   transporting the gas from the first chamber to a second chamber; and
   exposing the substrate, located in the second chamber to the gas to form a nitrogen containing layer thereon to grow a layer on the substrate, the material of the layer including nitrogen from the nitrogen containing substance and material from the substrate.

18. The method of claim 17 wherein the layer is formed at a rate of less than 10 Å per minute.

19. The method of claim 17 wherein the substance has a chemical formula: $N_xO_y$.

20. The method of claim 17 wherein x=2; y=1.

21. A method of forming an oxygen and chlorine containing layer on a semiconductor substrate, comprising:

heating $C_2H_2Cl_2$ within a first chamber to a temperature of above 700° C. to cause decomposition thereof into a chlorine containing gas;

cooling the gas to below 700° C.;

transporting the gas from the first chamber to a second chamber; and exposing a semiconductor substrate, located in the second chamber, to oxygen and the chlorine of the gas to grow a layer on the substrate, the layer including oxygen and chlorine from the gas and material from the semiconductor substrate.

22. The method of claim 21 wherein the gas is cooled to less than 675° C.

23. A method of forming a nitrogen containing layer on a semiconductor substrate, comprising:

heating $N_2O$ within a first chamber to a temperature above 850° C. to cause decomposition thereof into a nitrogen containing gas;

cooling the gas to below 850° C.;

transporting the gas from the first chamber to a second chamber;

exposing the substrate, located in the second chamber, to the gas to grow a nitrogen containing layer thereon the nitrogen containing layer including nitrogen from the gas and material from the substrate.

24. The method of claim 23 wherein the gas is cooled to below 825° C.

* * * * *